(12) United States Patent
Barsun

(10) Patent No.: US 7,102,889 B1
(45) Date of Patent: Sep. 5, 2006

(54) METHOD AND APPARATUS FOR ATTACHING HEAT SINK TO A COMPONENT WITH A FLEXIBLE LEAF SPRING MOUNT

(75) Inventor: Stephan Karl Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 173 days.

(21) Appl. No.: 10/950,859

(22) Filed: Sep. 27, 2004

(51) Int. Cl.
*H05K 7/20* (2006.01)
*A44B 1/04* (2006.01)

(52) U.S. Cl. ............... 361/704; 361/719; 257/718; 257/719; 165/80.3; 165/185; 24/296

(58) Field of Classification Search ............ 361/704, 361/719; 257/718, 719; 165/80.3, 185; 24/296, 458
See application file for complete search history.

(56) References Cited

U.S. PATENT DOCUMENTS

| | | | |
|---|---|---|---|
| 5,587,882 A | 12/1996 | Patel | |
| 5,638,258 A * | 6/1997 | Lin | 361/704 |
| 5,671,118 A * | 9/1997 | Blomquist | 361/704 |
| 6,175,499 B1 * | 1/2001 | Adams et al. | 361/704 |
| 6,318,452 B1 * | 11/2001 | Lee | 165/80.3 |
| 6,400,572 B1 * | 6/2002 | Wu | 361/704 |
| 6,462,951 B1 | 10/2002 | Letourneau | |
| 6,549,411 B1 | 4/2003 | Herbert | |
| 6,618,253 B1 * | 9/2003 | Szu et al. | 361/719 |
| 6,724,628 B1 | 4/2004 | Franz et al. | |
| 6,746,270 B1 | 6/2004 | Peterson et al. | |
| 6,822,869 B1 * | 11/2004 | Huang et al. | 361/704 |
| 2005/0174739 A1 * | 8/2005 | Chen et al. | 361/704 |

* cited by examiner

*Primary Examiner*—Boris Chervinsky

(57) ABSTRACT

The apparatus and method may have the following: a spring element that pivots about a pivot axis; a flexible mount coupled to the spring element such that the pivot axis of the spring element is constrained; and at least one portion of the spring element contacting a heat sink, the spring element in combination with the flexible mount deforming to apply a controlled load to the heat sink.

35 Claims, 6 Drawing Sheets

METHOD AND APPARATUS FOR ATTACHING HEAT SINK TO A COMPONENT WITH A FLEXIBLE LEAF SPRING MOUNT

BACKGROUND

The present invention relates generally to heat sinks for electronic components and more particularly to a mounting assembly of the kind that has tool-free heat sink retention and that accommodates a wide range of tolerances in a Z-axis stackup of a component.

Modern electronic appliances such as computers have many hundreds of integrated circuits and other electronic components, most of which are mounted on printed circuit boards. Many of these components generate heat during normal operation. Components that are relatively big or that have a relatively small number of functions in relation to their size, as for example individual transistors or small-scale integrated circuits, usually dissipate all their heat without a heat sink. The large physical sizes of such components, especially as compared with their active portions, limits their density on a circuit board sufficiently that there is enough room for any heat sinks that may be needed. Accordingly, any component that needs assistance in dissipating heat can have a heat sink of its own.

The term "heat sink" as used herein generally refers to a passive device, for example an extruded aluminum plate with a plurality of fins, which is thermally coupled to an electronic component to absorb heat from the component. The heat sink dissipates this heat into the air by convection.

One widely used method of increasing the speed of an electronic circuit is to reduce the lengths of the connecting wires. In part, this is accomplished by abandoning the older practice of enclosing each integrated circuit chip in a separate package in favor of mounting many chips next to each other on a single substrate. Such an assembly of chips and substrate is commonly referred to as a multi-chip module ("MCM"). However, since the chips are typically not all identical, the upper surface of these chips are not necessarily coplanar. In addition, the space required by the mounting hardware for an individual heat sink usually requires through holes in the printed circuit board. This negatively impacts routed traces in the area around the component being heat sinked.

Another known heat sink system uses shoulder screws and springs to maintain the appropriate compressive force to maintain the required thermal bond between the heat sink and an upper surface of a chip or other component on the substrate. However, such shoulder screws and springs can unevenly load the heat sink as the springs are torqued down. They also have many pieces, and require tools to install or service the component under the heat sink.

Simple spring or wireform clips may work well for small heat sinks, but are very limited in the force they apply to the heat sink because a user must be able to compress them. Therefore, they are limited to smaller heat sinks.

Those systems that have some type of clam shell/leaf spring arrangement require height above the heat sink. However, this reduces the height available for fins and limits performance in constrained areas.

One example of a compound wireform 100 is depicted in FIG. 1. The wireform 100 secures heat sink 102. A first end 104 of the wireform 100 has a pivot axis about which the wireform 100 pivots from an open position (not shown) to a closed position (depicted in FIG. 1). A second end 106 of the wireform 100 (or a section fo the wireform 100 in the vicinity of the second end 106) may be held in place by secondary clamp 108. This design allows more force to be applied to the heat sink. However, to generate the needed 60–100 lbs. of force, the wireform must be made of a large diameter (>4 mm) to withstand the stresses. Unfortunately, this gives the wireform a working deflection of only about 0.6 mm, not nearly enough to accommodate the ±0.4 mm of stack height variation and still maintain the 60 lbs's +/−15 lbs. target load on the component.

There have been many attempts to solve the problem of dissipating heat developed by high-power integrated circuit chips in an MCM. Some of these solutions are mechanically complex, or are expensive, or make it difficult or impossible to rework or service the MCM. For these and other reasons, none of the prior approaches has adequately solved the problem.

From the foregoing it is apparent that there is still a need for an apparatus and method that allows more force to be applied to the heat sink than in the prior art. Such need is for tool-free heat sink retention and accommodation of a wide range of tolerances in the Z-axis stackup of, for example, components on a printed circuit board.

SUMMARY

The invention in one embodiment encompasses an apparatus. This embodiment may have the following: a spring element that pivots about a pivot axis; a flexible mount coupled to the spring element such that the pivot axis of the spring element is constrained; and at least one portion of the spring element contacting a heat sink, the spring element in combination with the flexible mount deforming to apply a controlled load to the heat sink.

Another embodiment of the invention encompasses an apparatus. The apparatus in this example may have the following elements. A flexible spring steel mount may be coupled to the leaf spring such that the pivot axis of the leaf spring is constrained, the flexible spring steel mount allowing the pivot axis to move as the leaf spring is activated. At least one portion of the leaf spring contacts the heat sink, the leaf spring in combination with the flexible spring steel or other suitably elastic material mount deforming to apply a controlled load to the heat sink.

Yet another embodiment of the invention encompasses a method. The method in one example may have the steps of: positioning a heat sink over a heat-producing component; pivoting a leaf spring about a pivot axis such that at least one portion of the leaf spring contacts the heat sink; and flexing a spring steel mount that is coupled to the leaf spring such that the pivot axis moves as the leaf spring is pivoted, at least one portion of the leaf spring contacting the heat sink, the leaf spring in combination with the flexible spring steel mount deforming to apply a controlled load to the heat sink.

DESCRIPTION OF THE DRAWINGS

Features of exemplary implementations of the invention will become apparent from the description, the claims, and the accompanying drawings in which:

DETAILED DESCRIPTION

In general terms an embodiment of the apparatus may have the following: spring means for applying a spring force to a heat sink, the spring means pivoting about a pivot axis between an open position and a closed position; mount means for allowing the pivot axis to move as the spring means is moved between the open position and the closed position; and the spring means and the mount means functioning as two springs in series to reduce an effective spring rate and to increase a working deflection of the spring means. The embodiment may further have means for holding the spring means in the closed position. When the spring means is in the closed position, and in conjunction with the mount means, the spring means deform to apply a controlled load to the heat sink such that at least a thermal coupling is created between the heat sink and the heat-producing component.

More specifically, in one embodiment for coupling a heat sink with a heat-producing component, a leaf spring pivots about a pivot axis. A flexible spring steel mount may be coupled to the leaf spring such that the pivot axis of the leaf spring is constrained, the flexible spring steel mount allowing the pivot axis to move as the leaf spring is activated. At least one portion of the leaf spring contacts the heat sink, the leaf spring in combination with the flexible spring steel mount deforming to apply a controlled load to the heat sink.

As used herein the spring means may also be referred to as a spring element or a leaf spring. The mount means may also be referred to as a flexible spring steel mount.

Figure 1:
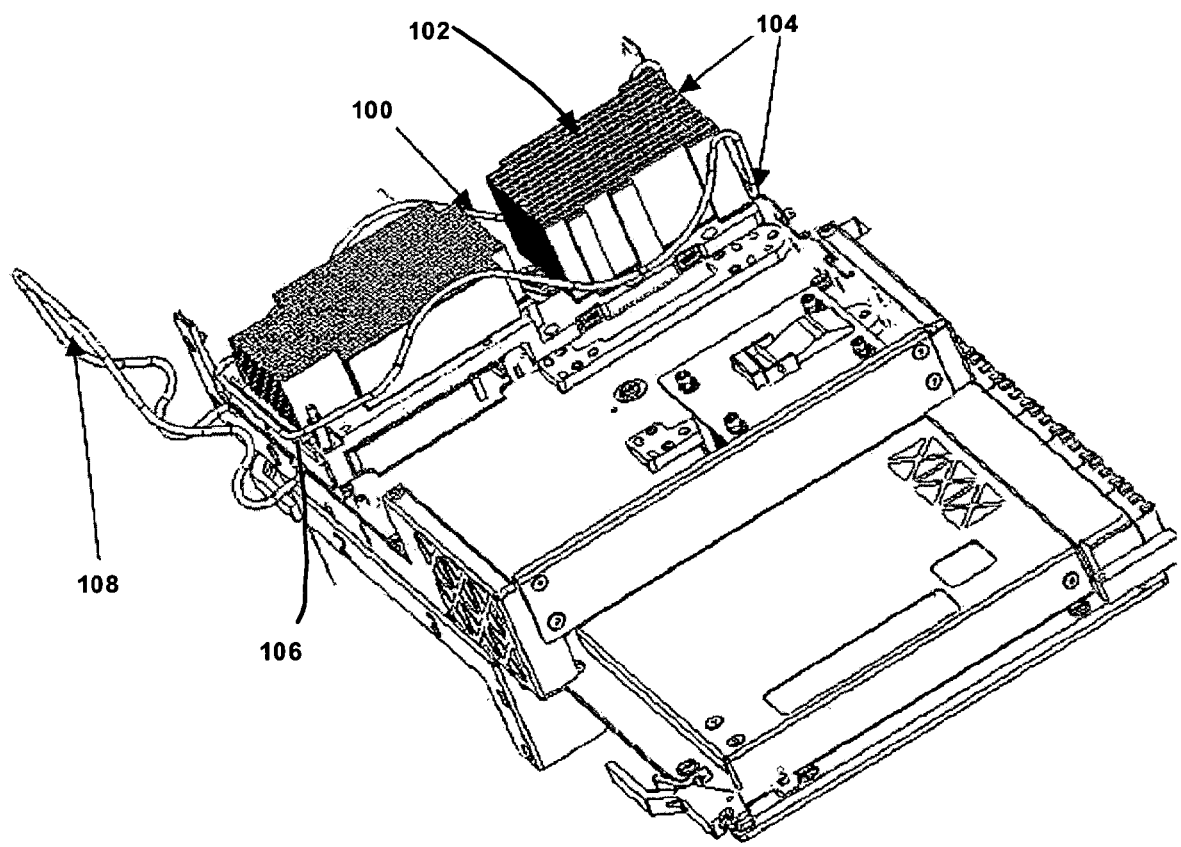
FIG. 1 is a representation of a prior art compound wireform.
Figure 2:
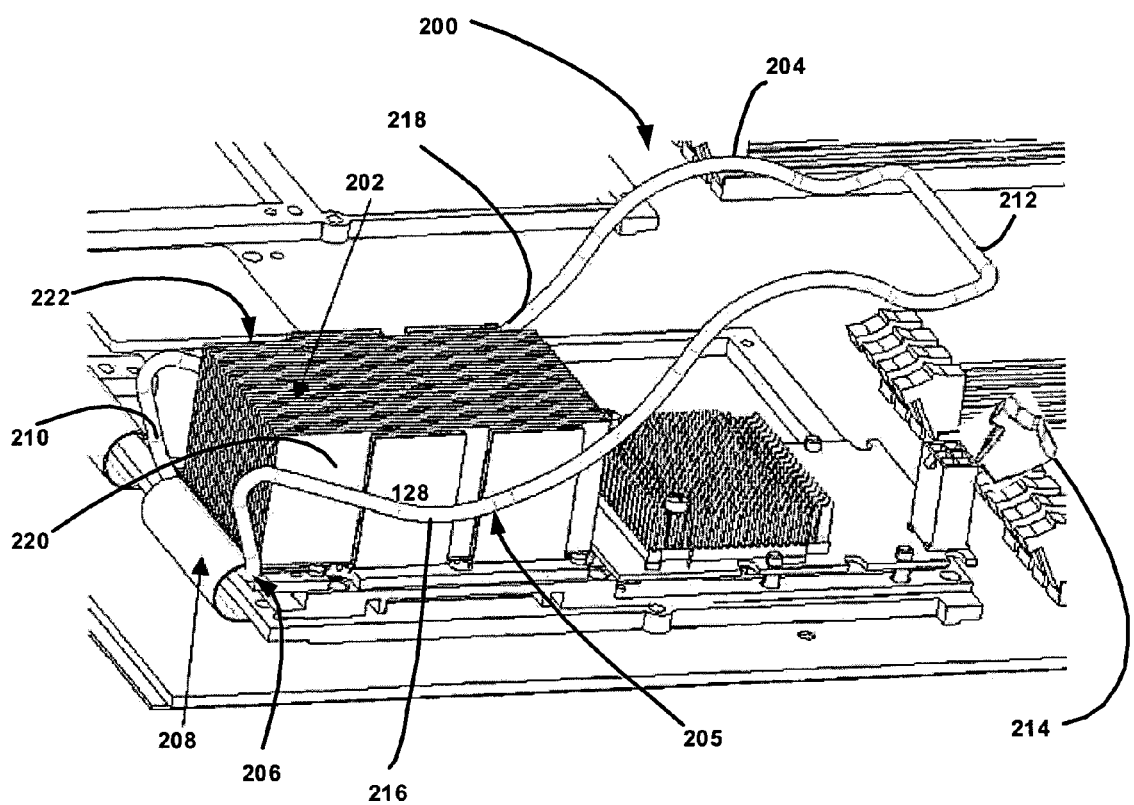
FIG. 2 is a representation of an embodiment with a spring element in an open position.
Figure 3:
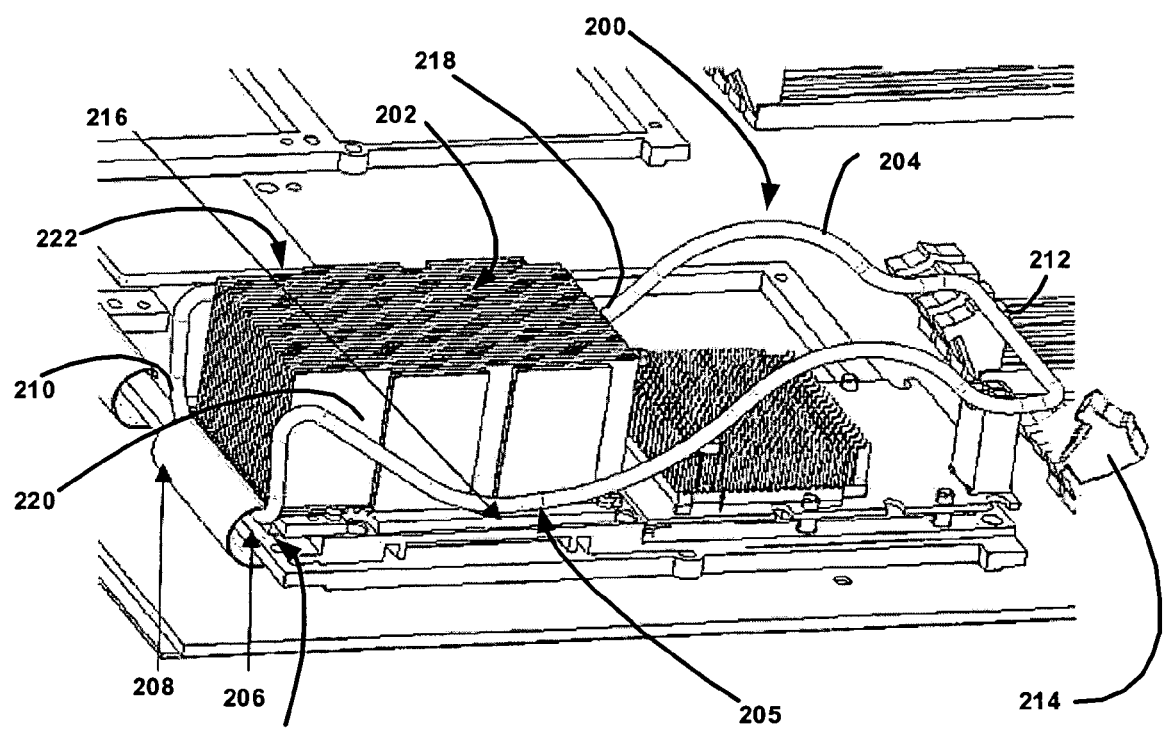
FIG. 3 is a representation of an embodiment showing the portion of the spring element contacting the heat sink.
Figure 4:
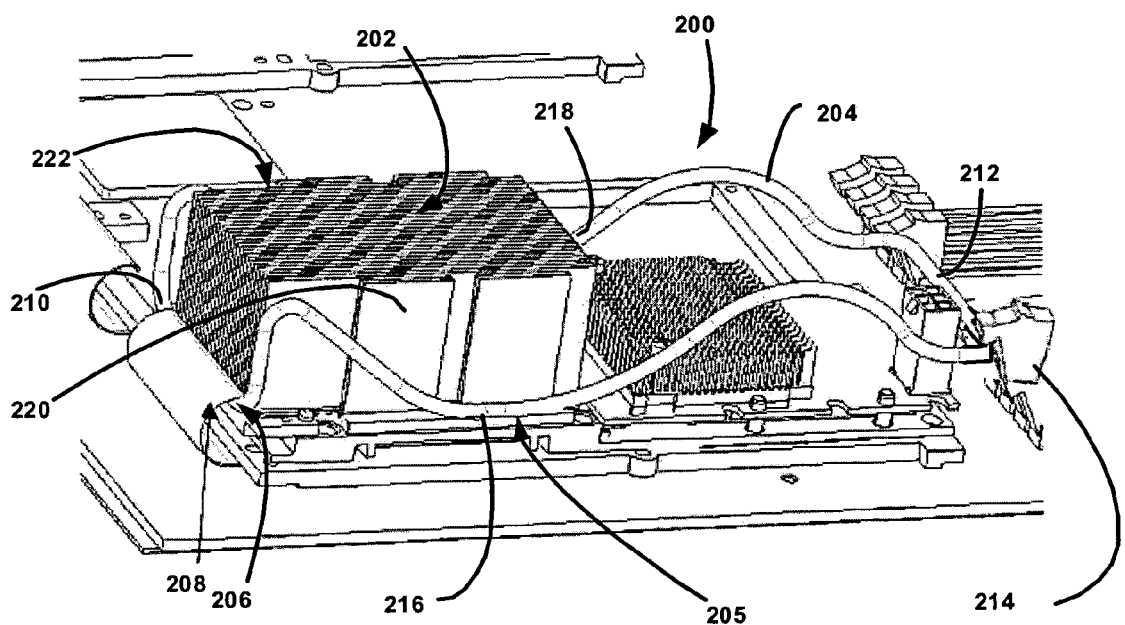
FIG. 4 is a representation of an embodiment with the spring element in a closed position.

As depicted in FIGS. 2–4, an apparatus 200, in one example, may be used for at least thermally coupling a heat sink 202 to a heat-producing component (the heat-producing component lies below the heat sink 202 in FIG. 2). The heat sink 202 may have thermal interface material applied, for example, to a surface the heat sink 202 that contacts the heat-producing component. The thermal interface material may be a thermal grease, for example.

As depicted in FIG. 2 in order to secure the heat sink 202 to the heat-producing component, the exemplary embodiment may have the following: a spring element 204 that pivots about a pivot axis 206; a flexible mount 208 coupled to the spring element 204 such that the pivot axis 206 of the spring element 204 is constrained; and at least one portion 205 of the spring element 204 for contacting the heat sink 202, the spring element 204 in combination with the flexible mount 208 deforming to apply a controlled load to the heat sink 202.

The flexible mount 208 may allow the pivot axis 206 to move upwards as the spring element 204 is activated (that is moved between open and closed positions). In this configuration the spring element 204 and the flexible mount 208 form two springs in series. The two springs in series reduce an effective spring rate and increase a working deflection of the spring element 204 where the at least one portion 208 of the spring element 204 contacts the heat sink 202 to better accommodate a wide tolerance variation of the heat sink 202 and the component(s) under it that are cooled by it.

In the exemplary embodiment the spring element 204 may have first and second ends 210, 212. The flexible mount 208 may be coupled to the first end 210 of the spring element 204, wherein the spring element 204 has a closed position in which the controlled load is applied to the heat sink 202. An open position of the spring element 204 allows the heat sink 202 to be placed above the heat-producing component in a predetermined location. The apparatus may further have a latch element 214 (only represented by a symbolic element; numerous types of latch elements are useable) that is attachable to the second end 212 of the spring element 204 to hold the spring element 204 in the closed position.

The spring element 204 may be formed from spring steel wire, which may have a predetermined configuration. The spring element 204 may also be referred to as a leaf spring. In the exemplary embodiment the portion 205 of the spring element 204 that contacts the heat sink 202 may be formed by two opposed segments 216, 218 of the spring wire 204. The two opposed segments 216, 218 may respectively contact opposed sides 220, 222 of the heat sink 202. The two opposed segments 220, 222 of the spring wire 204 effect independent compressive forces on the heat sink 202 that are substantially equal, the independent compressive forces forming the controlled load. This controlled load, which is applied to the heat sink 202, effects a coupling of the heat sink 202 with a heat-producing component. The portion 205 of the spring element 204 that contacts the heat sink 202 may be intermediate the first and second ends 210, 212 of the spring element 204.

FIG. 2 depicts the spring element 204 in an open position.

FIG. 3 depicts the portion 205 of the spring element 204 contacting the heat sink 202. In FIG. 3 neither the spring element 204 nor the mount element 208 exhibit any substantial flexing.

FIG. 4 depicts the spring element 204 in a closed position. In the closed position the spring element 204 has flexed, as well as, mount element 208. Flexing of the mount element 208 allows the first end 210 of the spring element 204 to move upward. The deforming of the spring element 204 in combination with the mount element 208 applies a controlled load to the heat sink 202. The latch element 214 may engage the second end 212 of the spring element 204 to hold the spring element 204 in the closed position.

Figure 5:
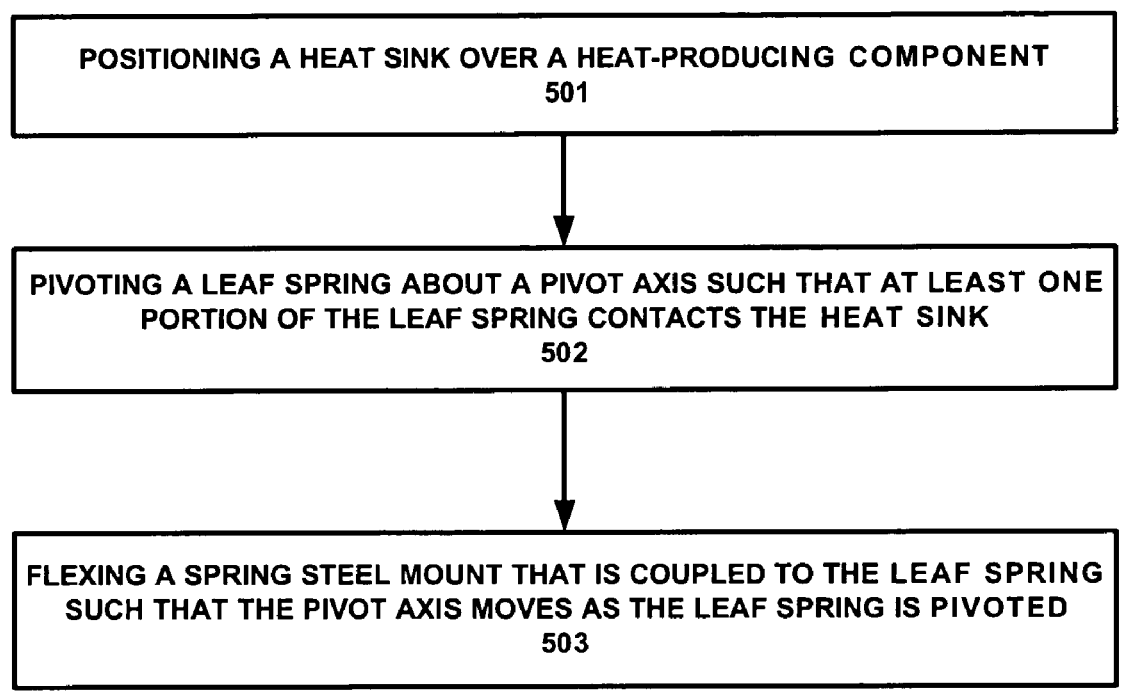
FIG. 5 is a representation of the general steps of a method of securing a heat sink.

FIG. 5 depicts a general block diagram of one example of the method. An exemplary embodiment of the method may have the steps of: positioning a heat sink over a heat-producing component (step 501); pivoting a leaf spring about a pivot axis such that at least one portion of the leaf spring contacts the heat sink (step 502); and flexing a spring steel mount that is coupled to the leaf spring such that the pivot axis moves as the leaf spring is pivoted (step 503), at least one portion of the leaf spring contacting the heat sink, the leaf spring in combination with the flexible spring steel mount deforming to apply a controlled load to the heat sink.

Figure 6:
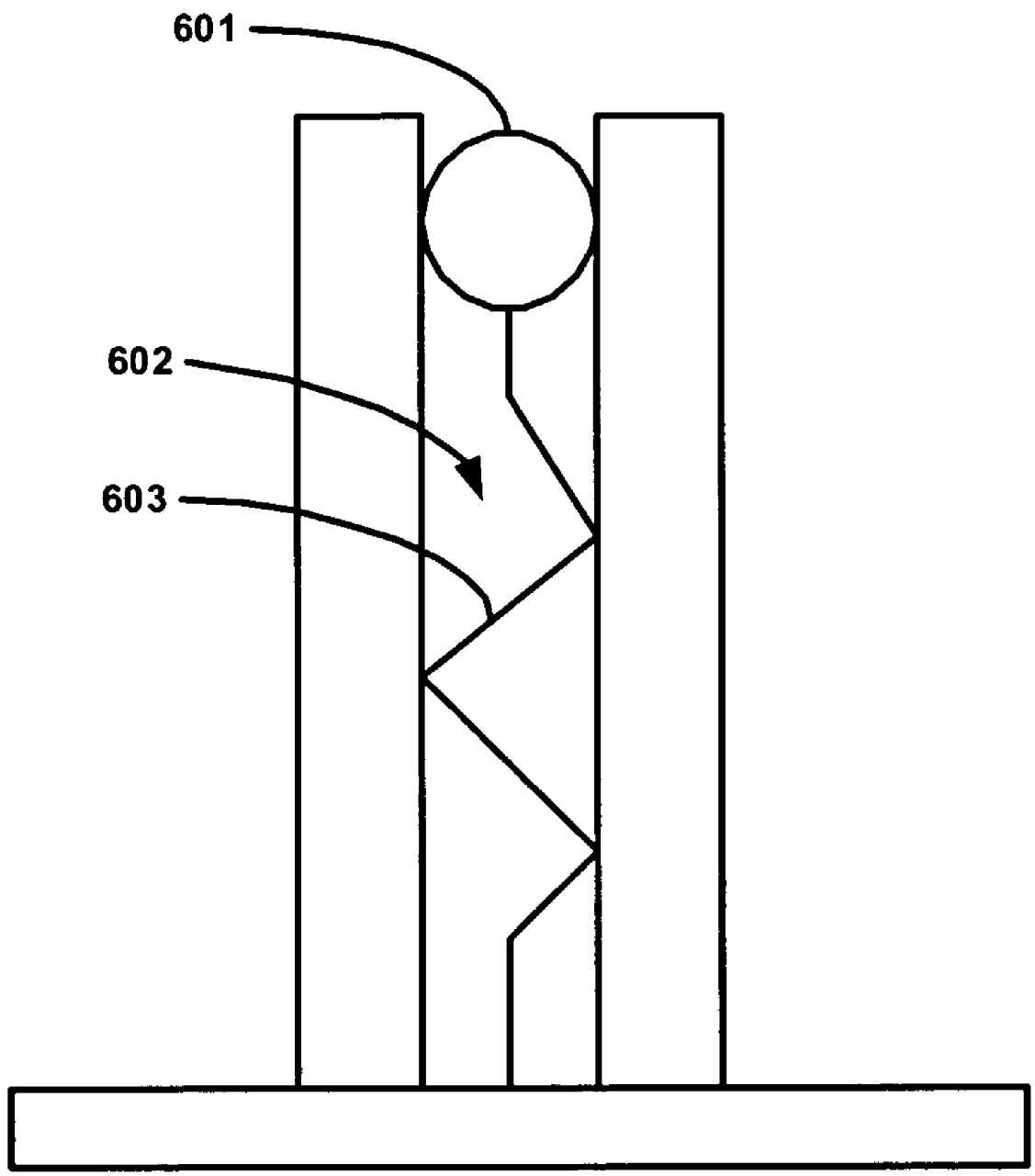
FIG. 6 depicts one embodiment of an alternative flexible mount.

The flexible mount may not only be a spring steel mount, but may be any material, such as elastomers, etc., that may serve as a spring. FIG. 6 depicts one embodiment of an alternative flexible mount. For example, the flexible mount may be a pivot 601 in a track or slot 602 with a coil spring 603. The pivot 601 may be coupled to a leaf spring as explained above. The slot 602 allows the pivot 601 to move up and down in the slot 602. The coil spring 603 (or other spring-type device) acts in series with the leaf spring that is coupled to the pivot 601.

The apparatus 200 in one example comprises a plurality of components such as hardware components. A number of such components can be combined or divided in one example of the apparatus 200. The apparatus 200 in one example comprises any (e.g., horizontal, oblique, or vertical) orientation, with the description and figures herein illustrating one exemplary orientation of the apparatus 200, for explanatory purposes.

Thus, the drawbacks of the prior art devices are overcome by embodiments of the present method and apparatus. This is accomplished in general by: a spring element that pivots about a pivot axis; a flexible mount coupled to the spring element such that the pivot axis of the spring element is constrained; and at least one portion of the spring element contacting a heat sink, the spring element in combination with the flexible mount deforming to apply a controlled load to the heat sink.

From the foregoing it is apparent that embodiments of the present method and apparatus fulfill the prior art need for an apparatus and method that allows more force to be applied to the heat sink. The present embodiments provide tool-free heat sink retention and accommodation of a wide range of tolerances in the Z-axis stackup of, for example, components on a printed circuit board.

More specifically, embodiments of the present method and apparatus evenly load the heat sink to provide appropriate compressive force to maintain the required thermal bond between the heat sink and an upper surface of a chip or other component on the substrate.

Furthermore, embodiments of the present method and apparatus to provide the appropriate compressive force without requiring unreasonable force that a user must exert to move the spring element from the open position to the closed position.

Also, embodiments of the present method and apparatus do not reduce the height available for fins or limit performance in constrained areas.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
   a spring element that pivots about a pivot axis;
   a flexible mount coupled to the spring element such that the pivot axis of the spring element is constrained; and
   at least one portion of the spring element contacting a heat sink, the spring element in combination with the flexible mount deforming to apply a controlled load to the heat sink wherein the flexible mount allows the pivot axis to move upwards as the spring element is activated.

2. The apparatus of claim 1, wherein the spring element and the flexible mount form two springs in series.

3. The apparatus of claim 2, wherein the two springs in series reduce an effective spring rate and increase a working deflection of the spring element where the at least one portion of the spring element contacts the heat sink to better accommodate a wide tolerance variation of the heat sink.

4. The apparatus of claim 1, wherein the spring element has a closed position in which the controlled load is applied to the heat sink, and wherein the apparatus further comprises a latch element that holds the spring element in the closed position.

5. The apparatus of claim 4, wherein the spring element has first and second ends, wherein the flexible mount is coupled to the first end of the spring element, wherein the spring element has a closed position in which the controlled load is applied to the heat sink, and wherein the apparatus further comprises a latch element that is attachable to the second end of the leaf spring element to hold the spring element in the closed position.

6. The apparatus of claim 1, wherein the spring element is formed from spring steel wire.

7. The apparatus of claim 6, wherein the spring wire has a predetermined configuration.

8. The apparatus of claim 7, wherein the portion of the spring element that contacts the heat sink is formed by two opposed segments of the spring wire that contact opposed sides of the heat sink.

9. The apparatus of claim 7, wherein the two opposed segments of the spring wire that contact opposed sides of the heat sink effect independent compressive forces on the heat sink that are substantially equal, the independent compressive forces forming the controlled load.

10. The apparatus of claim 7, wherein the portion of the spring element that contacts the heat sink is intermediate the first and second ends of the spring element.

11. The apparatus of claim 1, wherein the controlled load applied to the heat sink effects a coupling of the heat sink with a heat-producing component.

12. An apparatus, comprising:
    a leaf spring that pivots about a pivot axis;
    a flexible spring steel mount coupled to the leaf spring such that the pivot axis of the leaf spring is constrained, the flexible spring steel mount allowing the pivot axis to move as the leaf spring is activated;
    at least one portion of the leaf spring contacting a heat sink, the leaf spring in combination with the flexible spring steel mount deforming to apply a controlled load to the heat sink.

13. The apparatus of claim 12, wherein the leaf spring and the flexible spring steel mount form two springs in series.

14. The apparatus of claim 13, wherein the two springs in series reduce an effective spring rate and increase a working deflection of the leaf spring where the at least one portion of the leaf spring contacts the heat sink to better accommodate a wide tolerance variation of the heat sink.

15. The apparatus of claim 12, wherein the leaf spring has a closed position in which the controlled load is applied to the heat sink, and wherein the apparatus further comprises a latch element that holds the leaf spring in the closed position.

16. The apparatus of claim 12, wherein the leaf spring has first and second ends, wherein the flexible spring steel mount is coupled to the first end of the leaf spring, wherein the leaf spring has a closed position in which the controlled load is applied to the heat sink, and wherein the apparatus further comprises a latch element that is attachable to the second end of the leaf spring to hold the leaf spring in the closed position.

17. The apparatus of claim 12, wherein the leaf spring is formed from spring steel wire.

18. The apparatus of claim 17, wherein the spring wire has a predetermined configuration.

19. The apparatus of claim 18, wherein the portion of the leaf spring that contacts the heat sink is formed by two opposed segments of the spring wire that contact opposed sides of the heat sink.

20. The apparatus of claim 19, wherein the two opposed segments of the spring wire that contact opposed sides of the heat sink effect independent compressive forces on the heat sink that are substantially equal, the independent compressive forces forming the controlled load.

21. The apparatus of claim 16, wherein the portion of the leaf spring that contacts the heat sink is intermediate the first and second ends of the spring wire.

22. The apparatus of claim 12, wherein the controlled load applied to the heat sink effects a coupling of the heat sink with a heat-producing component.

23. A method, comprising:
positioning a heat sink over a heat-producing component;
pivoting a leaf spring about a pivot axis such that at least one portion of the leaf spring contacts the heat sink; and
flexing a spring steel mount that is coupled to the leaf spring such that the pivot axis moves as the leaf spring is pivoted, at least one portion of the leaf spring contacting the heat sink, the leaf spring in combination with the flexible spring steel mount deforming to apply a controlled load to the heat sink.

24. The method of claim 23, wherein the leaf spring and the flexible spring steel mount form two springs in series.

25. The method of claim 24, wherein the two springs in series reduce an effective spring rate and increase a working deflection of the leaf spring where the at least one portion of the leaf spring contacts the heat sink to better accommodate a wide tolerance variation of the heat sink.

26. The method of claim 23, wherein the leaf spring has a closed position in which the controlled load is applied to the heat sink, and wherein the method further comprises holding the leaf spring in the closed position.

27. The method of claim 23, wherein the leaf spring is formed from spring steel wire.

28. The method of claim 27, wherein the spring wire has a predetermined configuration.

29. The method of claim 28, wherein the portion of the leaf spring that contacts the heat sink is formed by two opposed segments of the spring wire that contact opposed sides of the heat sink.

30. The method of claim 29, wherein the two opposed segments of the spring wire that contact opposed sides of the heat sink effect independent compressive forces on the heat sink that are substantially equal, the independent compressive forces forming the controlled load.

31. The method of claim 28, wherein the portion of the leaf spring that contacts the heat sink is intermediate the first and second ends of the spring wire.

32. The method of claim 23, wherein the controlled load applied to the heat sink effects a coupling of the heat sink with a heat-producing component.

33. An apparatus, comprising:
spring means for applying a spring force to a heat sink, the spring means pivoting about a pivot axis between an open position and a closed position;
mount means for allowing the pivot axis to move as the spring means is moved between the open position and the closed position; and
the spring means and the mount means functioning as two springs in series to reduce an effective spring rate and to increase a working deflection of the spring means.

34. The apparatus of claim 33, wherein the apparatus further comprises means for holding the spring means in the closed position.

35. The apparatus of claim 33, wherein the spring means in the closed position, in conjunction with the mount means, deforming to apply a controlled load to the heat sink such that at least a thermal coupling is created between the heat sink and the heat-producing component.

* * * * *

UNITED STATES PATENT AND TRADEMARK OFFICE
CERTIFICATE OF CORRECTION

| | | |
|---|---|---|
| PATENT NO. | : 7,102,889 B1 | Page 1 of 1 |
| APPLICATION NO. | : 10/950859 | |
| DATED | : September 5, 2006 | |
| INVENTOR(S) | : Stephan Karl Barsun | |

It is certified that error appears in the above-identified patent and that said Letters Patent is hereby corrected as shown below:

In column 5, line 53, in Claim 1, after "sink" insert -- , --.

Signed and Sealed this

Fifth Day of January, 2010

David J. Kappos
*Director of the United States Patent and Trademark Office*